United States Patent [19]
Takemura

[11] Patent Number: 5,807,772
[45] Date of Patent: Sep. 15, 1998

[54] METHOD FOR FORMING SEMICONDUCTOR DEVICE WITH BOTTOM GATE CONNECTED TO SOURCE OR DRAIN

[75] Inventor: Yasuhiko Takemura, Kanagawa, Japan

[73] Assignee: Semiconductor Energy Laboratory Co., Ltd., Japan

[21] Appl. No.: 463,060

[22] Filed: Jun. 5, 1995

Related U.S. Application Data

[62] Division of Ser. No. 351,135, Nov. 30, 1994, which is a continuation of Ser. No. 72,127, Jun. 7, 1993, abandoned.

[30] Foreign Application Priority Data

Jun. 9, 1992  [JP]  Japan ................................ 4-174883

[51] Int. Cl.⁶ .................................................. H01L 21/54
[52] U.S. Cl. .......................................... 438/157; 438/638
[58] Field of Search .................... 437/21, 40 TFI, 437/40 TFT, 41 TFT, 195, 228, 915, 41 TFI; 156/633.1, 634.1, 650.1–655.1, 657.1; 430/313, 314, 316, 317; 438/157, 161, 638, 640, 740

[56] References Cited

U.S. PATENT DOCUMENTS

| | | | |
|---|---|---|---|
| 4,748,485 | 5/1988 | Vasudev | 257/348 |
| 4,977,105 | 12/1990 | Okamoto et al. | 437/195 |
| 5,034,788 | 7/1991 | Kerr | 257/365 |
| 5,124,769 | 6/1992 | Tanaka et al. | 257/66 |
| 5,198,379 | 3/1993 | Adan | 437/41 TFT |
| 5,246,882 | 9/1993 | Hartmann | 437/195 |
| 5,273,921 | 12/1993 | Neudeck et al. | 437/41 TFT |
| 5,275,972 | 1/1994 | Ogawa et al. | 437/195 |
| 5,470,793 | 11/1995 | Kalinitsky | 437/195 |

FOREIGN PATENT DOCUMENTS

| | | | |
|---|---|---|---|
| 57-32641 | 2/1982 | Japan | 437/195 |
| 61-88565 | 1/1986 | Japan | 257/365 |

OTHER PUBLICATIONS

K. Ishii et al., Jpn. J. Appl. Phys. 29(4) (1990) L521 "Experimental fabrication of XMOS transistors", Apr. 1990.

*Primary Examiner*—Charles L. Bowers, Jr.
*Assistant Examiner*—Leon Radomsky
*Attorney, Agent, or Firm*—Sixbey, Friedman, Leedom & Ferguson; Gerald J. Ferguson, Jr.; Jeffrey L. Costellia

[57] ABSTRACT

In a field effect type device having a thin film-like active layer, there is provided a thin film-like semiconductor device including a top side gate electrode on the active layer and a bottom side gate electrode connected to a static potential, the bottom side gate electrode being provided between the active layer and a substrate. The bottom side gate electrode may be electrically connected to only one of a source and a drain of the field effect type device. Also, the production methods therefor are disclosed.

4 Claims, 6 Drawing Sheets

METHOD FOR FORMING SEMICONDUCTOR DEVICE WITH BOTTOM GATE CONNECTED TO SOURCE OR DRAIN

This is a Divisional application of Ser. No. 08/351,135 filed Nov. 30, 1994; which itself is a continuation of Ser. No. 08/072,127 filed Jun. 7, 1993 abandonded.

BACKGROUND OF THE INVENTION

1. Field of the Invention

The present invention relates to an insulation gate type semiconductor device such as a thin film transistor (TFT) having a thin film active layer (i.e., an activated region or a channel region) formed on an insulation substrate. A field to which the invention pertains is a semiconductor integrated circuit, a liquid crystal display device, an optical reading device or the like.

2. Description of the Prior Art

Recently, researches and developments have been made as to insulation gate type semiconductor devices having thin film active layers on insulation substrates. In particular, continuous efforts have been made on so-called thin film transistors (TFTs). These TFTs are intended to be used for controlling respective image elements of matrix structure in a display device such as an LCD. Depending upon a material to be used and a crystalline condition of the semiconductors, TFTs are classified into amorphous silicon TFTs and polycrystal silicon TFTs. However, recently, a material having an intermediate condition between the polycrystalline condition and amorphous condition has been studied. This is called a semi-amorphous condition and is considered as a condition where small crystals are floated on an amorphous formation.

Also, in a single crystal silicon IC, a polycrystal silicon TFT is used as a so-called SOI technique. For instance, this is used as a load transistor in a highly integrated SRAM. However, in this case, an amorphous silicon TFT is hardly used.

In general, an electric field mobility of a semiconductor under the amorphous condition is small, and it is therefore impossible to use the semiconductor as TFTs which need high speed operation. Also, in the amorphous silicon, the electric field mobility of P-type is small, and it is impossible to produce a P-channel type TFT (TFT of PMOS). Accordingly, it is impossible to form a complementary MOS circuit (CMOS) in combination with N-channel type TFT (TFT of NMOS).

However, TFTs formed of amorphous semiconductors have a feature that their OFF current is small. Therefore, such TFTS have been used where an extremely high speed operation is not needed like a liquid crystal active matrix transistor, one-way conductive type TFTs may be satisfactorily used and TFTs having a high charge holding capacity are needed.

On the other hand, a polycrystal semiconductor has a larger electric field mobility than that of an amorphous semiconductor. Therefore, in this case, it is possible to effect high speed operation. For example, with TFTs using a silicon film recrystallized through a laser anneal technique, it is possible to obtain a large electric field mobility of 300 $cm^2/Vs$. This value is considered very high in view of the fact that the electric field mobility of a regular MOS transistor formed on a single crystal silicon substrate is approximately 500 $cm^2/Vs$. In addition, the operation speed of the MOS circuit on the single crystal silicon substrate is considerably limited by an inherent capacitance between the substrate and wirings. In contrast, since the TFT is located on the insulation substrate, such a limitation is no longer needed and a considerably high speed operation is expected.

Also, it is possible to obtain PTFTs as well as NTFTs from polycrystal silicon, and hence it is possible to form a CMOS circuit thereby. For example, in a liquid crystal display device, a so-called monolithic structure is known in which not only active matrix portions but also peripheral circuits (such as drivers or the like) are formed by polycrystal CMOS TFTs. This point is noticed also in the TFTs used in the aforesaid SRAMs. In this case, PMOSs are formed by TFTs and are used as a load transistor.

However, in general, the polycrystal TFTs have an increased leak current and a poor performance of holding the electric charge of image elements of the active matrix since the electric field mobility of the polycrystal TFTs is larger than that of amorphous TFTs. For example, in the case where the polycrystal TFTs are used as the liquid crystal display elements, since conventionally, the size of the image elements is several hundreds of micrometers square and the image element capacities are large, there have been no serious problems. However, recently, the fine image elements have been used in accordance with a high resolution, and the image element capacities become small. The conventional image elements would be insufficient for stable static display.

There have been several solutions for the current leakage problems inherent in such polycrystal TFTs. One of the methods is to thin an active layer. It is reported that the OFF current would be small by the method. For instance, it is known that a thickness of the active layer is 25 nm whereby the OFF current might be less than $10^{-13}$A. It would be however very difficult to crystallize a thin semiconductor film and it is actually known that the thin semiconductor film could not easily be crystallized.

The method in which the active layer is thinned leads to the phenomenon in which a source/drain region is thinned. This is because the semiconductor film is formed so that the source/drain region is produced simultaneously with the formation of the active layer in accordance with a conventional production method and the source/drain region and the active layer have the same thickness. This would also lead to the increased resistance of the source/drain region.

For this reason, a method is used in which a thickness of almost all the source/drain region is increased. This means that a mask process is additionally used. This is undesired from the view point of productive yield.

Also, according to the present inventors' knowledge, in the TFTs where a thickness of the active layer is 50 nm or less, a MOS threshold voltage is largely shifted, and this phenomenon is remarkable in case of NMOS's. The threshold voltage would be zero or negative values. If, thus, the CMOS is formed by the TFTs, the operation would be unstable.

On the other hand, if the thickness of the active layer would be increased, the leakage current would be increased. The magnitude thereof is not in proportion to the thickness of the active layer. It is therefore reasonable that the leakage current would be increased in a non-linear manner due to some causes. The present inventors have studies and found that almost all the leakage current of the TFTs where the active layer is thick may flow through a part of the active layer on the substrate side in a bypass fashion. Two causes thereof might be found out. One cause is that there is a charge fixed to an interface energetic position between the substrate and the active layer. The other cause is that movable ions such as sodium or the like enter from the substrate into the active layers to thereby make conductive the part of the active layer on the substrate side. The later cause may be overcome by increasing a performance of the cleaning process.

However, whatever the interface between the substrate and the active layer was made clean, it was impossible to overcome the problem of the former cause. For example, the direct formation of the active layer on the substrate would lead to raising the interface energetic position. Accordingly, it was impossible to obviate the problem of the leakage current even if an oxide layer (such as heat oxide film of silicon) having a high quality to the same extent as that of the gate oxide film was used as an underlayer and the active layer was formed thereon. Namely, it has been found that it is difficult to remove the fixed charge.

SUMMARY OF THE INVENTION

In order to solve the above-noted defects or difficulties, according to the present invention, an additional gate electrode (hereinafter referred to as a bottom side gate electrode) is formed between a substrate and an active layer, and this gate electrode is kept at a suitable potential whereby the stationary charge described above may be cancelled.

According to the present invention, in a field effect type device having a thin film-like active layer, there is provided a thin film-like semiconductor device comprising a top side gate electrode on the active layer and a bottom side gate electrode connected to a static potential, the bottom side gate electrode being provided between the active layer and a substrate.

According to another aspect of the invention, in a field effect type device having a thin film-like active layer, there is provided a thin film-like semiconductor device comprising a top side gate electrode on the active layer and a bottom side gate electrode (rear electrode) electrically connected to only one of a source and a drain of the field effect type device, the bottom side gate electrode being provided between the active layer and a substrate.

According to still another aspect of the invention, there is provided a thin film-like semiconductor device comprising a bottom side gate electrode (rear electrode) on a substrate having an insulating surface, a semiconductor layer having N-type and P-type impurity regions for covering the bottom side gate electrode, and two gate electrodes provided on the semiconductor layer, one of the last-mentioned gate electrodes being located out of the bottom side gate electrode. A p-type transistor is provided on the insulating surface and comprises an active region and a gate electrode provided on the active region. An n-type transistor is provided on the insulating surface and comprises another active region and another gate electrode provided on the another active region. The active region of only one of the p-type transistor and the n-type transistor is provided on the rear electrode. The rear electrode is kept at a potential of the source of the only one of the p-type transistor and the n-type transistor.

Preferably, the gate electrode of P-channel type transistor is located out of the bottom side gate electrode.

According to the invention, there is provided a method for producing a thin film-like semiconductor device, comprising the following steps: selectively forming a first semiconductor coating film, having a first conductive (conductivity) type, on a substrate having an insulating surface; forming a first insulating coating film on the first semiconductor coating film; forming a second semiconductor coating film for covering the first insulating coating film; forming a second insulating coating film on the second semiconductor coating film; forming at least two gate electrode portions on the second insulating coating film; dispersing impurities for the first conductive type into the second semiconductor coating film in a self-alignment manner relative to the gate electrode portions; and after the dispersing step, in a self-alignment manner relative to at least one of the gate electrode portions, dispersing impurities for a conductive (conductivity) type opposite the first conductive type in the second semiconductor coating film below which the first semiconductor coating film is not present.

According to the invention, there is provided a method for producing a thin film-like semiconductor device, comprising the following steps: forming, on a substrate having an insulating surface, a first conductive coating layer made of one selected from the group essentially consisting of semiconductor and metal; forming a first insulating coating film on the first conductive coating film; forming a first semiconductor coating film on the first insulating coating film; forming a second insulating coating film on the first semiconductor coating film; forming an etching mask material on the second insulating coating film; forming a hole in the etching mask material; forming a contact hole in the second insulating coating film in accordance with an isotropic etching process while using the etching mask material as a mask, that is, through an opening of the etching mask; forming a hole (an opening) in the first semiconductor coating film in accordance with an anisotropic etching process while using the etching mask material as a mask; and forming a hole (an opening) in the first insulating coating film in accordance with one of the isotropic etching process and the anisotropic etching process while using the etching mask material as a mask, thereby forming an electrode connected between the first conductive coating film and the first semiconductor film.

DESCRIPTION OF THE PREFERRED EMBODIMENTS

The present invention will now be described with reference to the accompanying drawings.

Figure 1A:
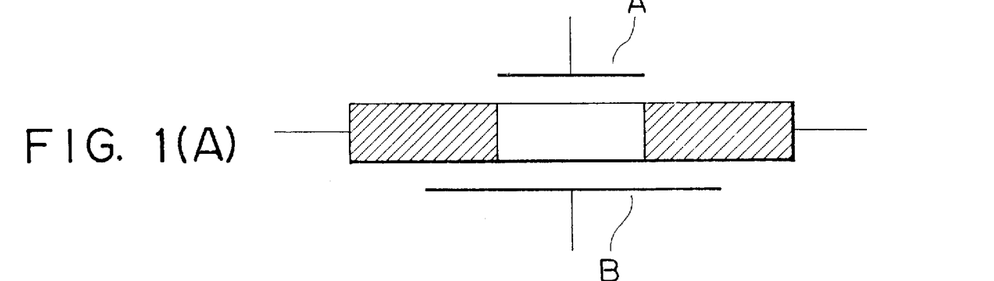
FIGS. 1A and 1B are illustrations of inventive concept of TFTs according to the invention.
Figure 1B:
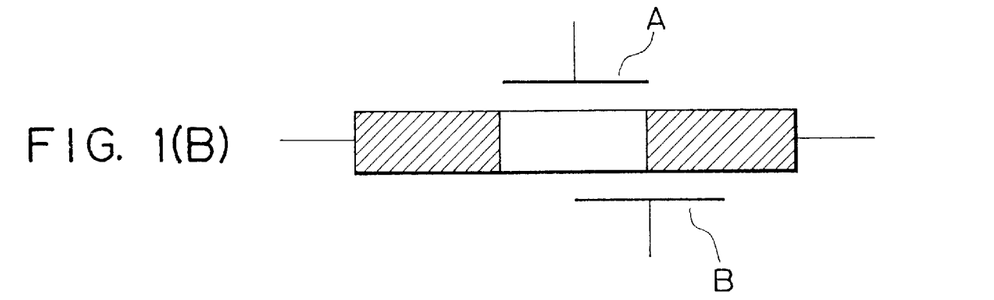

FIGS. 1A and 1B show an inventive concept of the present invention. Reference character A denotes a gate electrode which is well known in the art. Reference character B denotes a gate electrode provided on a bottom side. Such a bottom side gate electrode B may be disposed so as to be overlapped with the face surfaces of source/drain regions as shown in FIG. 1A. However, in this arrangement, additional capacitances between the source/drain regions and the bottom side gate electrode would be increased. In the case where the high speed operation or the like is required, as shown in FIG. 1B, it is possible to take the arrangement where the bottom side gate electrode B is located so as not to overlap with either one or both of the source region and the drain region. In any case, it is important that the bottom side gate electrode is overlapped with at least a part of the active layer. In order to insure the advantage of the invention, it is located so as to transverse the active layer as much as possible.

Figure 4:
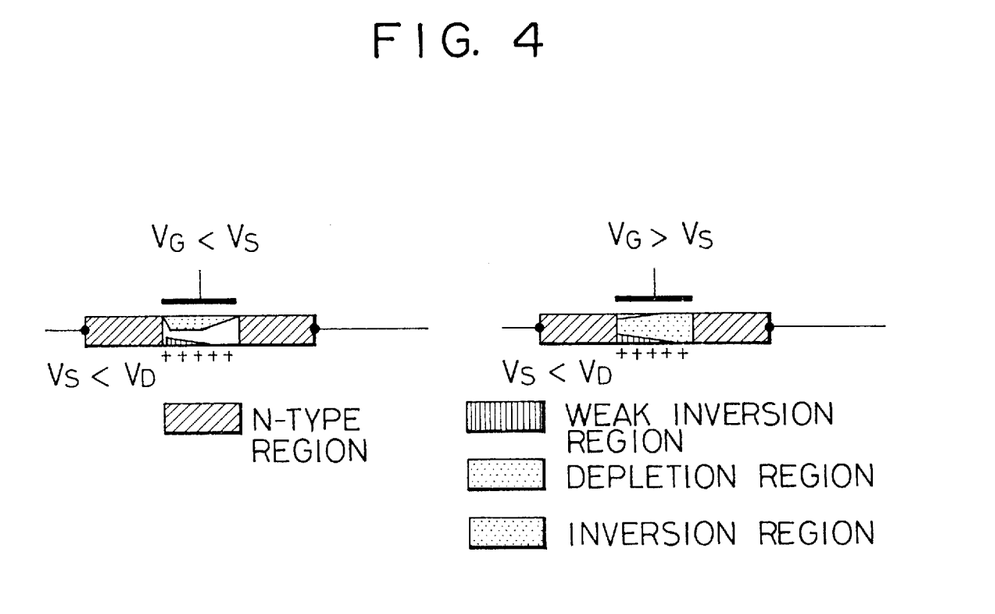
FIG. 4 shows the operation of the TFTs according to the prior art.

For instance, in a conventional NMOS, in the case where the electric potentials of the source and the gate are kept at zero and the potential of the drain is kept at 10V, the drain current have to be zero in an ideal condition. However, the fixed charge on the substrate cause the active layer to be kept in a weak inversion state. Therefore, the drain current will flow by a thermal excitation. This is shown in FIG. 4. Namely, in a conventional TFT, a weak inversion region is formed by the fixed charge on the substrate side as shown in FIG. 4. Since the fixed charge is present without any change whatever voltage is applied to the gate electrode, it becomes a source of the leakage current. However, in the case where a thickness of the active layer is extremely decreased, the affect of the gate electrode is applied also to the substrate so that this weak reversed region will be obviated by the potential of the gate. It is assumed that various reports that the leakage current may be reduced by thinning the active layer without any good reason may be based upon the foregoing reasons. However, in the models shown in FIG. 4, it has been found that the threshold voltage is readily shifted, and the conventional method is not an essential solution.

Figure 2A:
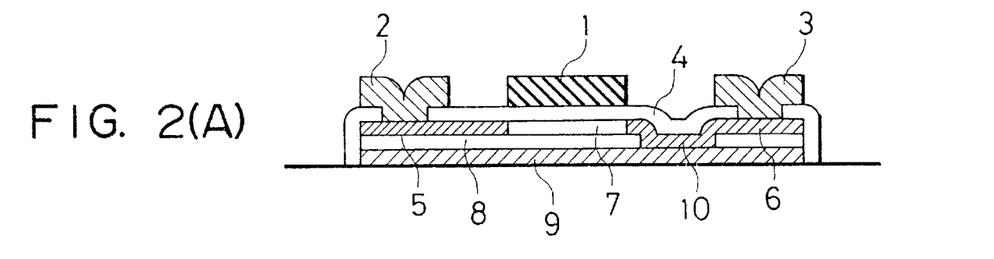
FIGS. 2A and 2B are cross-sectional views showing examples of TFTS.
Figure 2B:
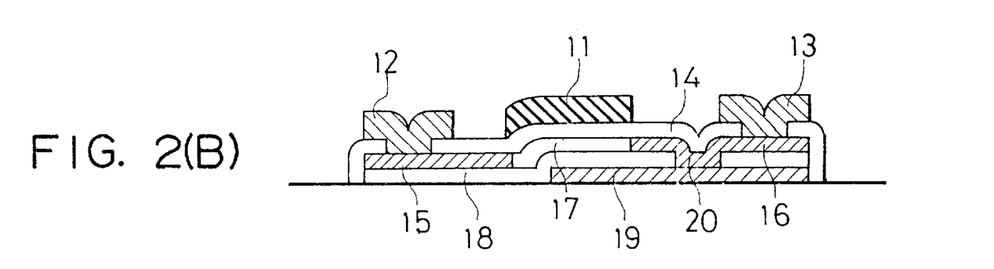

The purpose of the present invention is to remove the affect of the fixed charge by providing the above-described bottom side gate electrode and keeping the potential of the bottom side gate electrode (rear electrode) at zero or negative values. FIGS. 2A and 2B show examples of the present invention in which a bottom side gate electrode (a rear electrode) is electrically connected to a source region through a contact hole provided in a portion of an insulating film so that the bottom side gate electrode may be always kept at the same potential as that of the source. In FIG. 2A, the bottom side gate electrode 9 is overlapped exactly with the source region 6 and the drain region 5. In this case, the manufacture process would be relatively simple and yield is high since no stepped portion would be formed in the gate electrode 9.

In order to produce an element having such an arrangement, the following steps should be carried out. Namely, a coating film to be the bottom side gate electrode 9 and an insulating film 8 are formed on the substrate. A contact hole 10 is formed in the insulating film 8 and a semiconductor layer is formed therein. These components are subjected to a patterning process. Then, the gate insulating film 4 and the gate electrode 1 are formed and the drain region 5 and the source region 6 are formed in a self-alignment manner. Parts where no impurities are doped will become the active layer 7. Finally, a drain electrode 2 and a source electrode 3 are formed thereon. The number of the masks used in the foregoing steps is four (five in the case where the source electrode 3 and the drain electrode 2 are not simultaneously formed).

On the other hand, FIG. 2B shows the example where the bottom side gate electrode 19 is not overlapped with the drain region 15. The step of the bottom side gate electrode causes an adverse affect to be applied to the gate electrode 11. For this reason, there would be a fear that the exfoliation or removal problem would be applied to the gate electrode. Also, the number of processing steps is increased in comparison with the case shown in FIG. 2A. Namely, first of all, the bottom side gate electrode 19 is patterned, and subsequently, the insulating film 18 is formed to form a contact hole 20. Then, the semiconductor layer is formed and is patterned. Then, the gate electrode 11 is patterned. The source region 14, drain region 15 and active region 17 are formed in a self-alignment manner. The source electrode 13 and the drain electrode 12 are formed thereon. The number of the masks used in the foregoing steps is five or six. It is an ideal condition that the additional capacitance is reduced and the bottom side electrode is formed in the self-alignment manner with the source region and the drain region in order to simplify the process.

The material for the bottom side gate electrode 9, 19 should be selected in view of the process to be applied to the material. For instance, in the case where the gate insulation film is formed in accordance with the thermal oxidation method, the material should stand the high temperature corresponding to the method and the dispersion of the different harmful elements from the bottom side gate material to the active layer should be avoided. For example, if the active layer is formed of silicon and the gate insulation film is a thermal oxidation film of silicon, in general, the maximum processing temperature exceeds 1,000° C. Accordingly, a doped polysilicon is desired as the material for the bottom side gate electrode.

Also, in a low temperature process in which the maximum processing temperature is about 600° C., it is possible to use the doped silicon but it is more preferable to use lower resistance substances such as chrome, tantalum and tungsten. Of course, any other material may be used as a design choice as desired.

Figure 3A:
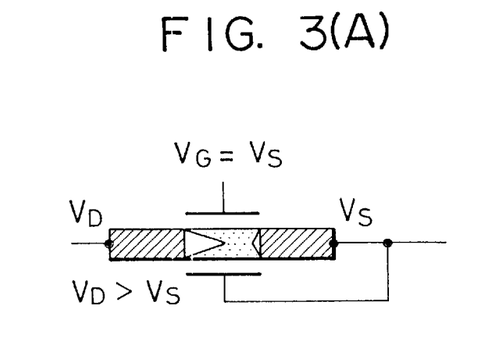
FIGS. 3A to 3H are illustrations showing the operation of the TFTs according to the invention.
Figure 3B:
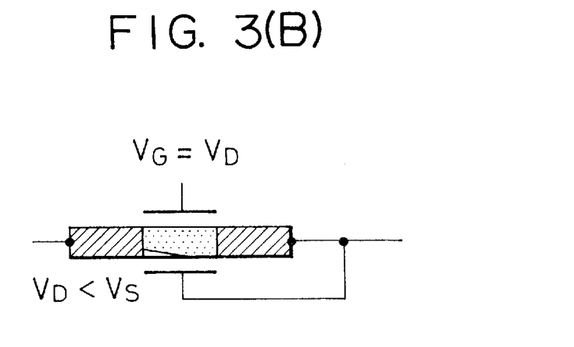

FIGS. 3A to 3H show the operation of the thus constructed TFT. FIGS. 3A to 3H show the case of an NMOS. However, in case of a PMOS, the inequalities used in these figures should be directed opposite those shown. First of all, the explanation will be made as to the case where the gate potential $V_G$ is equal to either lower one of the source potential $V_S$ or the drain potential $V_D$. In this case, as shown in FIG. 4, since the potentials of the source and the drain are not symmetric with each other, the state depends upon the magnitude of the potential $V_D$. When the relation, $V_S<V_D$, is established, as shown in FIG. 3A, the gate electrode, the bottom side gate electrode and the source are kept at the same potential so that the electrons are discharged from these regions to form depletion regions or accumulation region. Inversely, when the relation, $V_S<V_D$, is established, as shown in FIG. 3B, the gate electrode side is a depletion region but an inversion region is formed on side of the bottom side gate electrode to allow the drain current to flow. The above discussion is very rough and more strictly, the threshold voltage should be considered but the discussion would be used to understand the concept of the present invention.

Figure 3C:
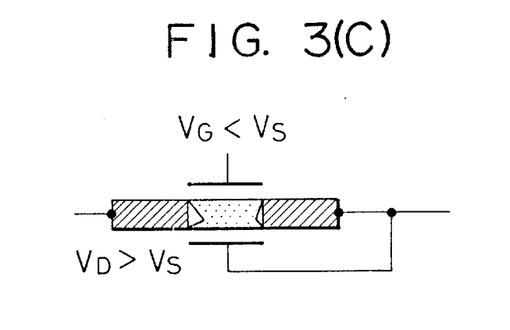
Figure 3D:
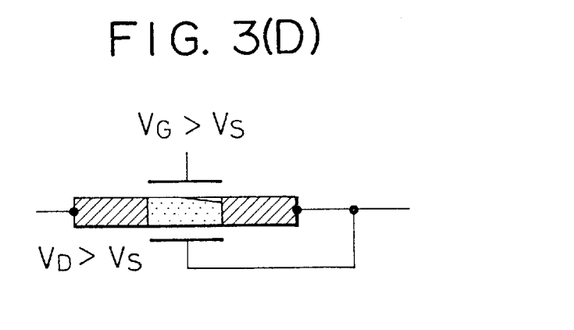
Figure 3E:
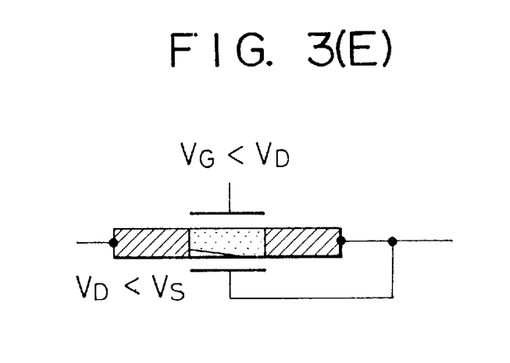

Under the condition, $V_D>V_S$ and $V_G<V_S$, is given, the depletion region expands over all the active layer (see FIG. 3C), whereas under the condition, $V_D>V_S$ and $V_G>V_S$, is given, the inversion region is formed on the gate electrode side (see FIG. 3D). Also, under the conditions, $V_D<V_S$ and $V_G<V_D$, the inversion region is formed on the bottom gate electrode side to allow the drain current to flow (see FIG. 3E), whereas under the conditions, $V_D<V_S$ and $V_G>V_D$, the inversion regions are formed on both sides (see FIG. 3F).

The state will become more complicated in the case where $V_D$ is equal to or substantially equal to $V_S$. Namely, in this case, since there are no lines of electric force flowing from the source to the drain (or from the drain to the source), the affect of the fixed charge on the bottom gate electrode side causes a weak inversion region to be formed to generate the leakage current as in the conventional TFTs (see FIGS. 3G and 3H).

It is practically convenient that the bottom side gate electrode is kept at the same potential as that of the source or the drain. If it is impossible to meet this requirement, it is sufficient to keep the bottom gate electrode at the same potential as that of other power supply (other power source). Also, even if it is kept at the same potential as that of the source or drain, if the potential is kept unchanged, there is little adverse affect to the operation characteristics of the element.

Figure 3F:
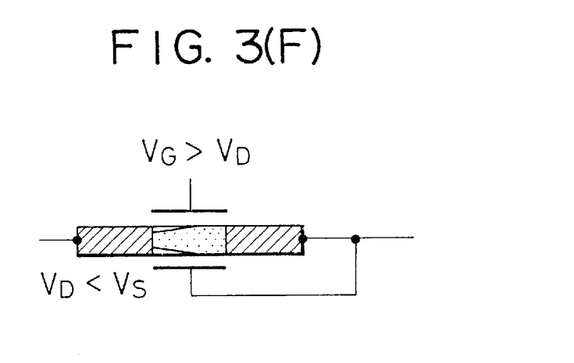
Figure 3G:
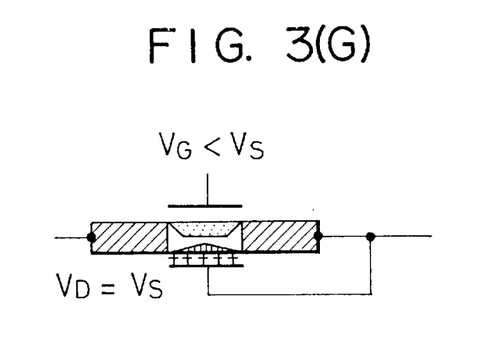
Figure 3H:
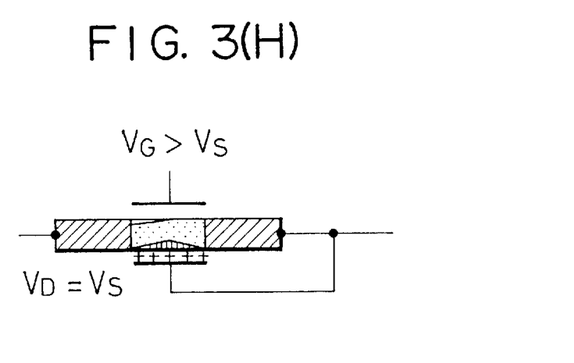

For example, in the case where the amount of leakage in the OFF condition is reduced, and the ON/OFF operation is carried out by the TFT, the potentials are selected so as to realize the states shown in FIG. 3A or 3C (OFF condition) and FIG. 3D or 3F or FIG. 3H (ON condition). Also, it is possible to use the element to form a CMOS inverter circuit.

The problem of the fixed charge is remarkable mainly in the NMOS. Therefore, the PMOS is made in the same manner as in the conventional method and the present invention may be applied only to the NMOS. However, in the case where the charge is negative, the charge causes a problem even in the PMOS and hence it is preferable to apply the invention for both cases.

EXAMPLE 1

A method for producing crystallized silicon TFTs through a high temperature process according to the present invention will now be described. In this example, the gate electrode as well as the bottom side gate electrode was made of doped polysilicon. The manufacturing process is well known in the art, i.e., conventional processing techniques for various semiconductor integrated circuits and hence the detailed discussion thereof will be omitted.

Figure 5A:
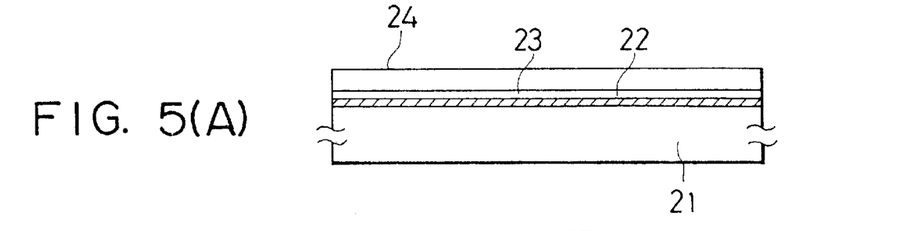
FIGS. 5A to 5F show the steps for producing the TFTs according to the present invention.

A polycrystal silicon film which was doped with phosphorus of $10^{19}$ to $5 \times 10^{20}$ cm$^{-3}$, for example, $8 \times 10^{19}$ cm$^{-3}$ was formed on a quartz substrate 21 with a thickness of 100 to 500 nm, for example, 200 nm according to a low pressure CVD process. This was thermally oxidized in an oxygen atmosphere kept at 1,000° C. to form a silicon coating film 22 and silicon oxide film 23. A thickness of the silicon oxide was in the range of 50 to 200 nm, preferably at 70 nm. In this case, a silicon film which is doped with no impurity may be formed and then the impurity may be doped into the silicon film or otherwise the impurity may be doped thereinto after the silicon film has been thermally oxidized.

Thereafter, the amorphous silicon film 24 which was not doped with impurities was accumulated to have a thickness of 100 to 1,000 nm, for example, 300 nm. During the accumulation, a temperature of the substrate was kept in the range of 450° to 500° C., for example, 480° C. Also, the material gas was monosilane or polysilane (disilane, trisilane). However, disilane was stabler than polysilanes over the trisilane and might cause the better film to be formed than the monosilane. The crystal had been slowly grown at 600° C. for twelve hours. The arrangement until this step is shown in FIG. 5A.

Figure 5B:
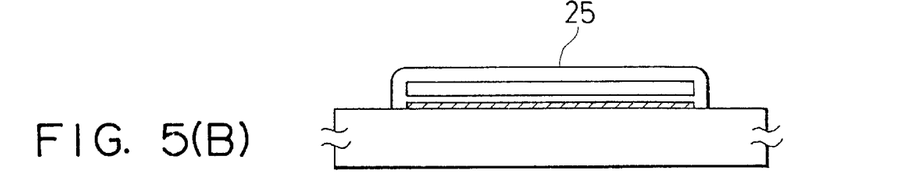

Subsequently, the patterning was effected so that island-like semiconductor regions (i.e., silicon islands) and the rear electrodes (the bottom side gate electrodes) thereunder were formed. A silicon oxide film 25 which was to be a gate insulating film was formed to have a thickness 50 to 500 nm, for example, 150 nm by thermal oxidation in the oxygen atmosphere. This condition is shown in FIG. 5B.

Figure 5C:
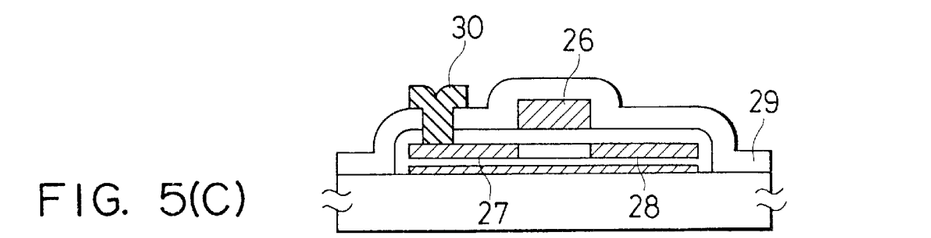

Further, a polycrystal silicon film doped with phosphorus was formed to a thickness in the range of 300 to 1,000 nm, for example, 500 nm according to the low pressure CVD method, and the film was subjected to the patterning technique to form the gate electrode 26. An ion injection was effected in a self-alignment manner by using the gate electrode as a mask and was annealed at 1,000° C. to form the source region 28 and the drain region 27. An active region (a channel) was then formed in the island-like semiconductor region between the source region 28 and the drain region 27. An insulating material 29 was formed in accordance with a plasma CVD method of TEOS and a contact hole was provided to the insulating material to form the drain electrode 30. This state is shown in FIG. 5C.

Thereafter, the source electrode was formed. This process was peculiar. Thus, the process will be described in detail. After the drain electrode had been formed, an insulating material 31 to be interposed between layers was formed. A photoresist 32 was formed by a spin coating process. A hole 33 was formed for forming a contact hole of the source electrode.

Figure 5D:
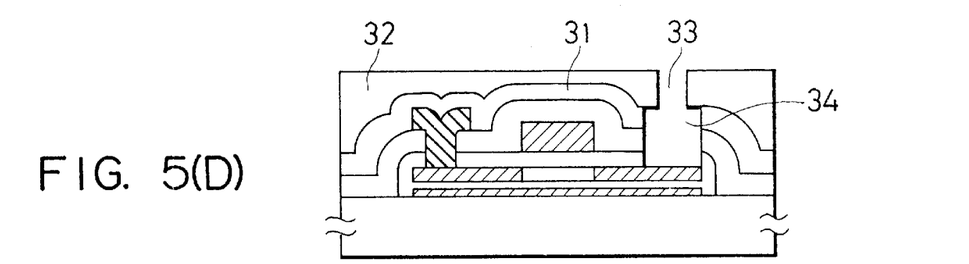

Subsequently, the intermediate insulating layer and the gate insulating coating (both made of silicon oxide) were etched by an isotropic etching technique such as an isotropic dry etching process or an isotropic wet etching process. In this case, it is desired to selectively and solely etch the silicon oxide coating. For example, it is preferable to use a hydrofluoric acid as an etchant. In a relatively long period of etching time, the etching expanded to side walls of the contact hole. The contact hole 34 which was larger than the hole 33 was formed. This state is shown in FIG. 5D.

Figure 5E:
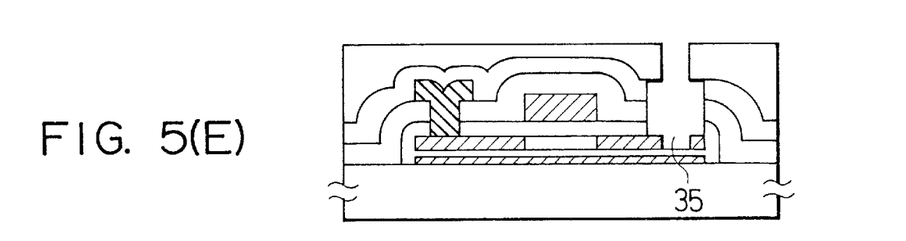

Then, an anisotropic etching process such as an RIE (reactive ion etching) was effected so that the source region 28 was etched substantially corresponding to the hole 33 to form a contact hole 35. This state is shown in FIG. 5E. Thereafter, a thin silicon oxide layer present between the source region and the bottom side gate electrode was removed.

Figure 5F:
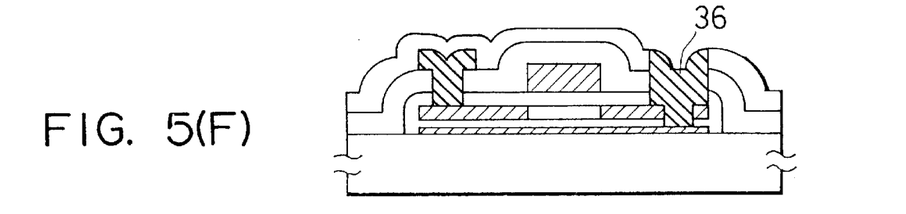

After the photoresist had been removed, the source electrode 36 was formed of metal wiring material. Namely, by the above-described two-stage etching process, a sufficient contact of a sufficient contact hole was made between the source region and the bottom side gate electrode. This is shown in FIG. 5F. Thus, the TFT was completed. As shown in FIG. 5F, an insulating film exists between the rear electrode and the active region.

Figure 6A:
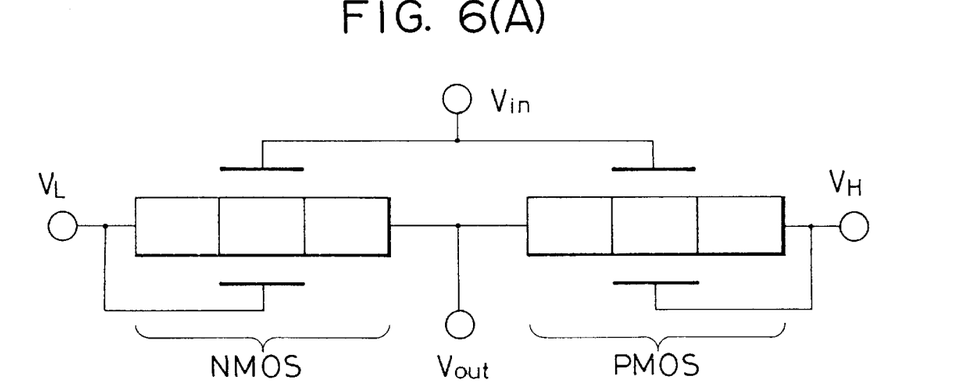
FIGS. 6A to 6F show the application of the TFTs according to the invention.
Figure 6B:
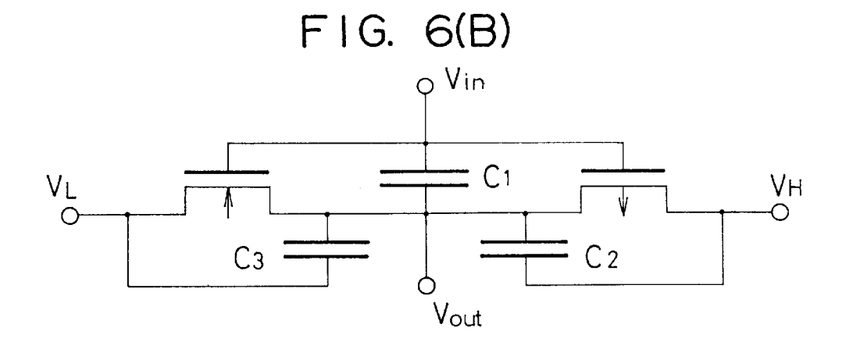

A CMOS inverter circuit was constituted by combining the TFTs of the thus formed NMOS and PMOS as shown in FIG. 6A. A circuit diagram of the circuit is shown in FIG. 6B. In this inverter circuit, the bottom side gate electrode is always kept at a potential of the source ($V_H$ in case of the PMOS and $V_L$ in case of the NMOS). Namely, in a static condition, if Vin is $V_H$ (i.e., Vout is $V_L$), the NMOS was in the condition shown in FIG. 3H and the PMOS was in the condition shown in FIG. 3A. Inversely, if Vin is $V_L$ (i.e., Vout is $V_H$), the NMOS is in the state shown in FIG. 3A and the PMOS is in the state shown in FIG. 3H, thereby extremely suppressing the leak current on the substrate side.

The reason why the leak current may be reduced only by keeping the bottom side gate electrode at the same potential as that of the source will be explained hereunder.

Figure 6C:
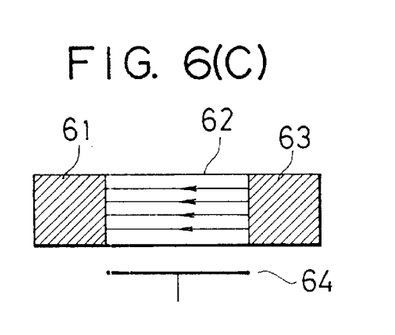
Figure 6D:
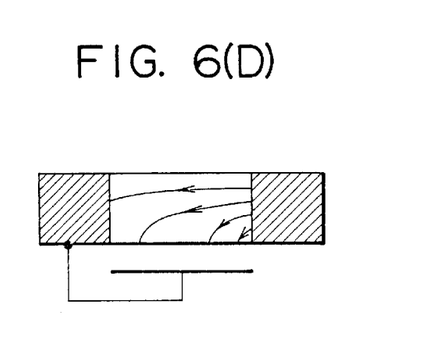
Figure 6E:
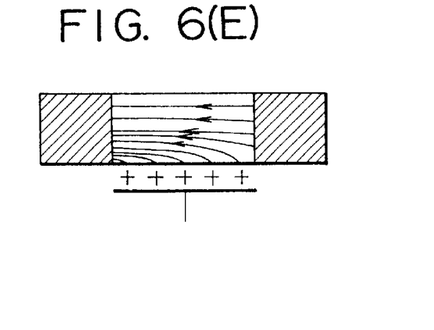
Figure 6F:
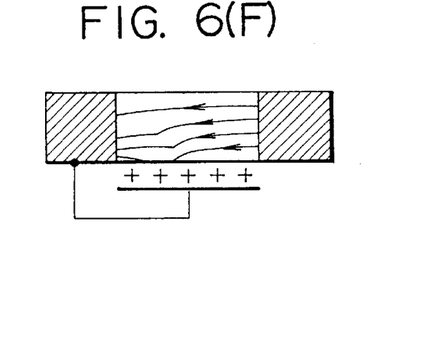

Namely, assume that the drain 61 is higher in potential than the source 63 in the NMOS as shown in FIG. 6C. If there would be no bottom side gate electrode or even if there would be the bottom side gate electrode but if the bottom side gate electrode 64 would be in a floating state, lines of electric forces from the drain to the source transverses the active region 62 straightforwardly as shown in FIG. 6C. However, if the bottom side gate electrode is kept at the same potential as that of the source, the part of the electric force lines which would inherently be directed to the source is attracted toward the bottom side gate electrode and is curved as shown in FIG. 6D.

As a matter of fact, since a fixed charge is present on an interface between the active layer region and the insulating coating, the state is complicated. Namely, if there would be no bottom side gate electrode or it would be in the floating state, the electric force lines would be affected by the fixed charge (whose polarity is positive) so that electric force lines having a component directed from the insulating coating (or the bottom side gate electrode) to the active layer are generated. Since the pattern of the electric force lines means that the potential of the insulating film (or the bottom side gate electrode) is higher than that of the inner side of the active layer, the electrons will be attracted by the potential so that a weak inversion region is formed close to the insulating film interface. Since this weak inversion region is continuously generated from the drain to the source, it causes the leak current.

On the other hand, in the case where the bottom side gate electrode is kept at the same potential as that of the source, even if the stationary charge Represent between the active layer and the insulating film (or the bottom side gate electrode), since the electric force lines emitted from the drain have a component toward the bottom side gate electrode, both the electric force lines are cancelled by each other so that almost no electric force lines are generated from the bottom side gate electrode to the active layer surface. Also, even if the electric force lines having such a component are partially generated, since the electric force lines are not generated over all the region between the source to the drain, there is almost no fear that the leak current will be generated.

Thus, by keeping the bottom side gate electrode at the source potential, it is possible to considerably reduce the leak current. For example, in the case of the CMOS circuit, the maintenance current in the static condition is kept substantially at a sum of the leak currents of the NMOS and the PMOS. However, in the conventional TFTs, if the drain. voltage is 5V, approximately 1 pA will flow. For example, in a static RAM of 1 Mbits, there are about two millions of CMOS inverter circuits, and in order to keep the memory, a current of about 2 micron A will always flow.

However, according to the present invention, in particular, the leak current was considerably reduced, and the maintenance current for one CMOS inverter was reduced to 0.01 to 0.1 pA. Thus, the holding current for 1 Mbit SRAM was reduced to 0.02 to 0.2 micron A. In the case where the present invention is applied to a non-volatile memory provided a back-up battery for an SRAM, it is possible to extend a service life of the battery 10 to 100 times longer than that of the conventional one.

It should be noted that there are inherent capacitances $C_2$ and $C_3$ of the drain and the source through the bottom side gate electrode in addition to the capacitance $C_1$ of the gate electrode and the channel which capacitance is incorporated as a design factor in the conventional CMOS inverter circuit. The inherent capacitances serve as loads to reduce the signal transmission speed during the operation of the inverter and to increase the consumption power. According to the simple calculation, the signal delay time is in proportion to the sum of $C_2$ and $C_3$ and the consumption power is in proportion to a four order exponential value of the sum.

Accordingly, it is desired to reduce the inherent capacitances as much as possible. Actually, since the stationary charge is almost positive, it does not adversely affect the PMOS. Accordingly, it is effective to use the PMOS having the same structure as that of conventional ones and to apply the bottom side gate electrode according to the present invention only to the NMOS. In a simple consideration, it is possible to reduce the inherent capacitances to half the ones comprising $C_2$ and $C_3$, and accordingly to reduce the power loss due to the inherent capacitances to one sixteenth of the level.

EXAMPLE 2

A method for producing a crystallized silicon TFTs according to a high temperature process utilizing the present invention will be described in the following example. In this example, both the gate electrode and the bottom side gate electrode were formed of doped polysilicon. The manufacture technique is well known as a process for various semiconductor integrated circuits and hence detailed explanation will be omitted.

Figure 7A:
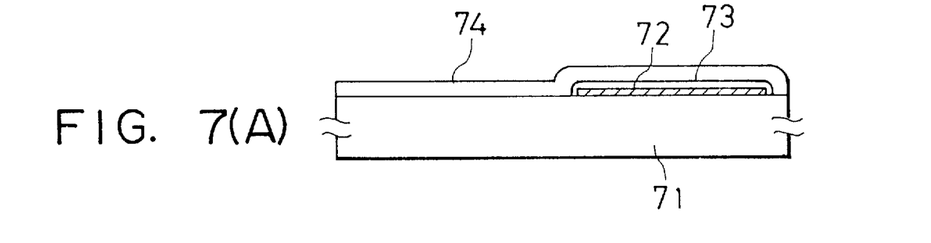
FIGS. 7A to 7E show the process for manufacturing the TFTs according to the invention.

A polycrystal silicon film doped with phosphorus (n-type impurity) under the same conditions as those of Example 1 was formed on the quartz substrate (insulating substrate) 71 and a patterning process was applied thereto to form a bottom side gate electrode 72. The film was thermally oxidized in an oxygen atmosphere to form a silicon oxide film 73. Thereafter, under the same conditions as those of Example 1, an amorphous silicon film 74 which had not been doped with the impurities was accumulated thereon and the crystallization was grown by a heat annealing process. This state is shown in FIG. 7A.

Figure 7B:
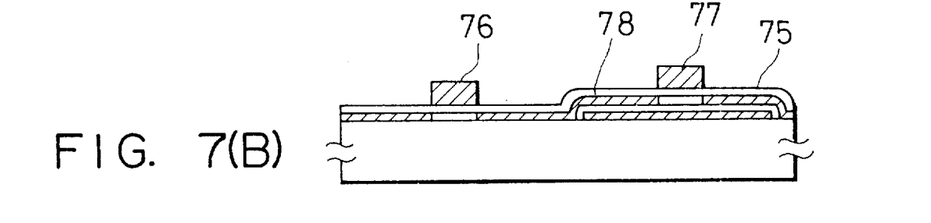

Subsequently, the patterning process was effected on the film to form an island-like semiconductor regions (silicon islands) and a thermal oxidized film 75 was formed in the same manner as in Example 1. Furthermore, a gate electrode 77 for an NMOS and a gate electrode 76 for a PMOS were formed by the doped silicon, and N-type impurity ions were injected into the island-like semiconductor region in a self-alignment manner to form an impurity region 78. In this case, although N-type impurities (for example, phosphorus or arsenic) were injected into the bottom side gate electrode, there was no problem because the bottom side gate electrode itself is of an N-type. This state is shown in FIG. 7B.

Figure 7C:
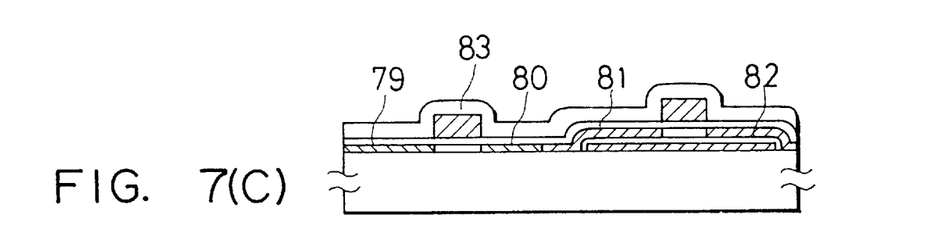

Then, a part on the right side of the shown TFT was covered by photoresist or the like, and the P-type impurity ions (boron or the like) were injected into a portion of the silicon film 74 which is not provided on the bottom side gate electrode 72. Through these steps, the source 79 and the drain 80 of the PMOS and the source 82 and the drain 81 of the NMOS were produced. This state was shown in FIG. 7C.

Figure 7D:
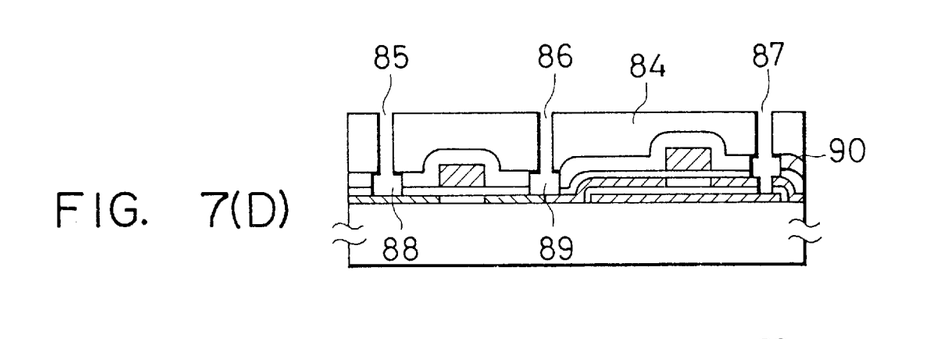

Thereafter, the photoresist 84 was applied over all the surface of the article. Holes 85 to 87 were formed at positions where contact holes were to be formed. Then, in the same process as in Example 1, the contact holes (openings) 88 to 90 were formed in the insulating layers between the layers and the gate oxide film (both of which are formed of silicon oxide) by the isotropic etching process. In any case, the contact holes were expanded more than the holes formed in the resist. Furthermore, according to the anisotropic etching process, the silicon layers were etched to the holes 85 to 87 and with respect to the contact hole 90, the thin silicon oxide layer below the contact hole 90 was also etched. The state is shown in FIG. 7D.

Figure 7E:
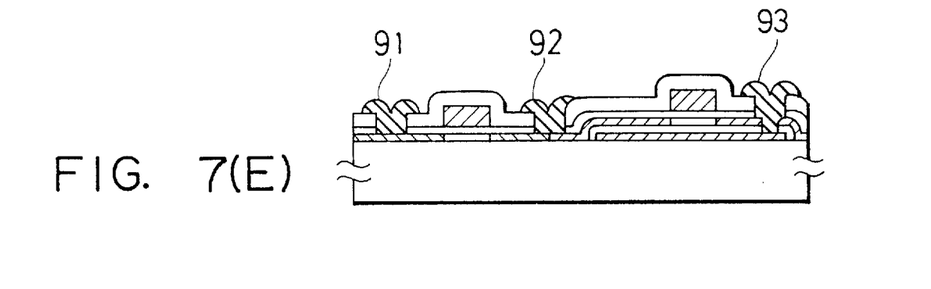

Finally, the electrodes 91 to 93 were formed of metal material as conductive regions. This state is shown in FIG. 7E. As shown in FIG. 7E, the rear electrode is electrically connected with the source of the n-type transistor. The electrode 91 was formed for a high potential, the electrode 93 was formed for a low potential, and the electrode 92 was formed for an output terminal to form an inverter. There is a fear that the inverter thus produced would have a large leak of the PMOS in comparison with that according to Example 1. However, in general, the leak current of the NMOS according to the present invention was reduced by one or two digits, whereas the leak current of the PMOS was improved by about one digit or less. As a result, even if the present invention was applied only to the NMOS, the difference in leak current between the NMOS and PMOS was reduced. Accordingly, the degradation of characteristics of the CMOS inverter circuit was not particularly observed.

In the CMOS inverter, under the high voltage input condition (where the NMOS was turned on and the PMOS was turned off), the leakage current depended upon the leakage current of the PMOS, whereas under the low voltage input condition (where the NMOS was turned off and the PMOS was turned on), the leakage current depended upon the leakage current of the NMOS. In the conventional TFTs, the leakage current of the NMOS was greater 100 times or more than that of the PMOS, and when this was applied to the SRAM circuit, in a single memory cell, any inverter was in the low voltage input condition (where the NMOS was turned off and the PMOS was turned on). After all, the leakage current of the SRAM circuit depended upon the leakage current of the NMOS.

Accordingly, in a practical aspect, as in this example, it was sufficient to reduce the leak current of the NMOS by one to two digits by providing the bottom side gate electrode only onto the NMOS. If the bottom side gate electrode would be provided for both the NMOS and the PMOS, almost all the leakage current would depend upon the NMOS. Rather, in consideration of the demerit due to the inherent capacitances of the bottom side gate electrode and the drain, it is reasonable to provide no bottom side gate electrode onto the PMOS.

As described above, it was possible to produce the TFTs having excellent characteristics with little leakage current. Also, as shown above, it was possible to enhance the characteristics of the CMOS by combining the TFTs. The TFTs may be applied to the high speed memory and the high speed logic circuit as well as liquid crystal displays and image sensors. The present invention may be applied to these equipments, and in addition, it is possible to enhance the various characteristics such as reliability and power consumption of these devices. In the specific examples, the high temperature process was taken into consideration and the specific method for being applied thereto was discussed. It is apparent that the present invention may be applied to the low temperature process. Incidentally, in the case where the low temperature process is used, an anode oxidation process as shown in Japanese Patent Application Laid-Open Nos HEI 4-38637 and HEI 4-54322 which are by the present applicants may be effectively utilized.

Also, the TFTs are used in a conventional monocrystal integrated circuit. However, apparently, it is possible to use the TFTs according to the present invention instead of the regular MOS transistors to further enhance the characteristics of the circuit rather than the conventional auxiliary purpose. Thus, the industrial evaluation of the present invention is large.

What is claimed is:

1. A method of forming a semiconductor device comprising:
    forming a conductive gate electrode on an insulating surface; forming a first insulating film on said gate electrode; forming a semiconductor film comprising source, drain and channel regions on said first insulating film; forming a second insulating film on said semiconductor film; forming a mask for etching on said second insulating film; isotropically etching said second insulating film through an opening in said mask to form a contact hole in said second insulating film; anisotropically etching said semiconductor film with said mask to form an opening in said semiconductor film; etching said first insulating film with said mask to form an opening in said first insulating film; and selectively forming a conductive electrode to electrically connect the gate electrode with the semiconductor film.

2. The method of claim 1 wherein said anisotropically etching step is carried out by reactive ion etching.

3. The method of claim 1 wherein said contact hole is wider than said opening of said mask by virtue of isotropy of said isotropically etching step.

4. The method of claim 1 wherein said contact hole formed in said second insulating film has a larger diameter than the opening opened in said semiconductor film so that said conductive electrode electrically contacts with an upper surface of said semiconductor film in said contact hole.

* * * * *